(12) United States Patent
Chan et al.

(10) Patent No.: US 9,998,277 B2
(45) Date of Patent: Jun. 12, 2018

(54) CONTROLLING A REFERENCE VOLTAGE FOR A CLOCK AND DATA RECOVERY CIRCUIT

(71) Applicant: Silicon Laboratories Inc., Austin, TX (US)

(72) Inventors: Hua Beng Chan, Singapore (SG); Rex Wong Tak Ying, Singapore (SG); Ricky Setiawan, Singapore (SG); Obaida Mohammed Khaled Abu Hilal, Singapore (SG)

(73) Assignee: Silicon Laboratories Inc., Austin, TX (US)

( * ) Notice: Subject to any disclaimer, the term of this patent is extended or adjusted under 35 U.S.C. 154(b) by 0 days. days.

(21) Appl. No.: 15/182,970

(22) Filed: Jun. 15, 2016

(65) Prior Publication Data

US 2017/0366333 A1    Dec. 21, 2017

(51) Int. Cl.
| | |
|---|---|
| *H04L 7/033* | (2006.01) |
| *H03L 7/099* | (2006.01) |
| *H03L 7/08* | (2006.01) |
| *G04F 10/00* | (2006.01) |
| *H04L 27/00* | (2006.01) |
| *H04L 7/00* | (2006.01) |

(52) U.S. Cl.
CPC .......... *H04L 7/0331* (2013.01); *G04F 10/005* (2013.01); *H03L 7/0807* (2013.01); *H03L 7/0991* (2013.01); *H04L 7/0087* (2013.01); *H04L 27/0002* (2013.01)

(58) Field of Classification Search
CPC ........ G06F 1/266; G06F 13/4282; G06F 1/26; H04L 12/10; H04L 12/40045; H04L 7/0331; H04L 7/0087; H04L 27/0002; G04F 10/005; H03L 7/0991
See application file for complete search history.

(56) References Cited

U.S. PATENT DOCUMENTS

2017/0242814 A1* 8/2017 Voor .................... G06F 13/385

OTHER PUBLICATIONS

Microchip Technology, Inc., "Introduction to USB Type-C™—AN1953," Jan. 30, 2015, 20 pages.
USB 3.0 Promoter Group, USB Type-C Cable and Connector Specification, "Universal Serial Bus Type-C Cable and Connector Specification," Revision 1.2 Mar. 25, 2016, 221 pages.
U.S. Appl. No. 15/182,951, filed Jun. 15, 2016, entitled "Digital Oversampling Clock and Data Recovery Circuit," by Hua Beng Chan, et al.

* cited by examiner

*Primary Examiner* — David S Huang
(74) *Attorney, Agent, or Firm* — Trop, Pruner & Hu, P.C.

(57) ABSTRACT

In one aspect, a method includes: determining a power mode of a device; setting a first reference voltage level and a second reference voltage level based at least in part on the power mode; and using at least one of the first reference voltage level and the second reference voltage level for comparison against incoming data.

18 Claims, 12 Drawing Sheets

CONTROLLING A REFERENCE VOLTAGE FOR A CLOCK AND DATA RECOVERY CIRCUIT

BACKGROUND

Various interconnection systems provide for communication of data and some also provide for power delivery The Universal Serial Bus Type-C specification provides for communication and power delivery using a single-ended receiver circuit to communicate data. This data is provided with an embedded clock signal, which operates at 600 kilohertz (kHz). However, this communication suffers from jitter, frequency drift and ground shifting in the data. As such, it is difficult for a receiver to recover the clock and retime the received data, since a general-purpose receiver is focused on instruction speed, low power and small area, rather than providing the USB Type-C reference clock. Thus, a conventional phase locked loop (PLL) or delay locked loop (DLL)-based clock and data recovery circuit (CDR) cannot work properly without the reference clock. In addition, a conventional CDR does not have fast phase track capability and is affected by fast events, for example, cycle-to-cycle jitter, fast frequency drift and ground shifting.

SUMMARY OF THE INVENTION

In one aspect, a method includes: determining a power mode of a device; setting a first reference voltage level and a second reference voltage level based at least in part on the power mode; and using at least one of the first reference voltage level and the second reference voltage level for comparison against incoming data.

In an implementation, the method further includes receiving the incoming data via a first input path of the device coupled to a first input node of a comparator and applying the at least one of the first reference voltage level and the second reference voltage level to a second input node of the comparator. The method may further include recovering a clock signal from the incoming data and sampling the incoming data using the clock signal. A result of a comparison between the incoming data and the at least one of the first reference voltage level and the second reference voltage level may be output as a sample input to a data sampler of the incoming data. Setting the first reference voltage level and setting the second voltage level may include accessing a table based on the power mode, e.g., via execution of firmware.

In an implementation, the method further includes determining the power mode during a power mode handshake process, the incoming data including bi-mark coded data. The method may further include: setting a first hysteresis voltage when the power mode of the device is determined to be in a source mode or a sink mode; and setting a second hysteresis voltage when the power mode of the device is determined to be in a source mode and a sink mode, the second hysteresis voltage less than the first hysteresis voltage.

In an implementation, the method further includes determining the power mode based on a power delivery negotiation between the device and a second device coupled to the device via a universal serial bus (USB) connection. The method may apply the at least one of the first reference voltage and the second reference voltage to a first input node of a comparator, where the incoming data is coupled to a second input node of the comparator.

In another aspect, a computer-readable medium includes instructions that when executed enable a system to perform operations including: performing a power mode negotiation with a device coupled to the system, the system including a receiver; determining a power mode for the receiver based at least in part on the power mode negotiation; accessing an entry of a table based on the determined power mode and obtaining at least one control code stored in the entry; and controlling at least one circuit element to provide a selected reference voltage level to a reference input node of a comparator of the receiver based on the at least one control code.

In an implementation, the non-transitory storage medium further includes instructions that when executed enable the system to perform operations including: controlling the at least one circuit element to provide a first reference voltage level to the reference input node based on a first control code when incoming data received in the comparator is a first logic level; and controlling the at least one circuit element to provide a second reference voltage level to the reference input node based on a second control code when the incoming data received in the comparator is a second logic level. Note that controlling the at least one circuit element may include controlling a plurality of switches coupled to a plurality of resistance elements based on one of the first control code and the second control code.

In an implementation, the non-transitory storage medium further includes instructions that when executed enable the system to perform operations including: receiving incoming data in the receiver; oversampling a first duration of the incoming data in a first time-to-data converter (TDC) and holding the oversampled first duration during receipt of a second duration of the incoming data; oversampling the second duration of the incoming data in a second TDC and holding the oversampled second duration during receipt of a third duration of the incoming data; and generating a recovery clock signal in a digitally controlled oscillator (DCO) based at least in part on the oversampled first duration and the oversampled second duration. The instructions may further enable the system to perform operations including: providing a system clock signal to the first and second TDCs, the system clock signal having a substantially greater frequency than the recovery clock signal; and providing a reference value to adjust the oversampled first duration and the oversampled second duration, the reference value corresponding to a ratio between the system clock signal and the recovery clock signal.

In another aspect, an apparatus includes: an analog front end to receive a digital input and output a data stream from the digital input, the analog front end including a comparator having a first input node to receive the digital input and a second input node to receive a reference voltage; a microcontroller coupled to the analog front end, the microcontroller to determine a power mode for the apparatus based at least in part on the digital input, obtain at least one control code stored in an entry of a storage based on the determined power mode, and control a controllable circuit element coupled to the second input node to provide a selected reference voltage level to the reference input node based on the at least one control code; and the controllable circuit element, where the microcontroller is to provide the at least one control code to the controllable circuit element to cause the controllable circuit element to provide the selected reference voltage to the second input node.

In an implementation, the apparatus includes a clock and data recovery circuit including: a first TDC to oversample a first duration of incoming data obtained from the digital input and hold the oversampled first duration during receipt of a second duration of the incoming data obtained from the digital input; a second TDC to oversample the second duration of the incoming data and hold the oversampled second duration during receipt of a third duration of the incoming data, the first and second TDCs to operate in opposing phases; a processing circuit coupled to the first TDC and the second TDC, the processing circuit including a first filter to filter the oversampled first duration and the oversampled second duration and generate a control output therefrom; and a DCO coupled to the processing circuit to receive the control output and generate a recovery clock signal therefrom.

In an implementation, the microcontroller is to control the controllable circuit element to provide a first reference voltage level to the second input node based on a first control code when the digital input is a first logic level, and control the controllable circuit element to provide a second reference voltage level to the second input node based on a second control code when the digital input is a second logic level. The controllable circuit element may include a plurality of switches coupled between a plurality of resistance elements and the second input node. The apparatus may further include a non-volatile storage including a plurality of entries, each entry to store one or more control codes for control of the controllable circuit element, where the microcontroller is to access an entry of the non-volatile storage based on the determined power mode.

DETAILED DESCRIPTION

Figure 1:
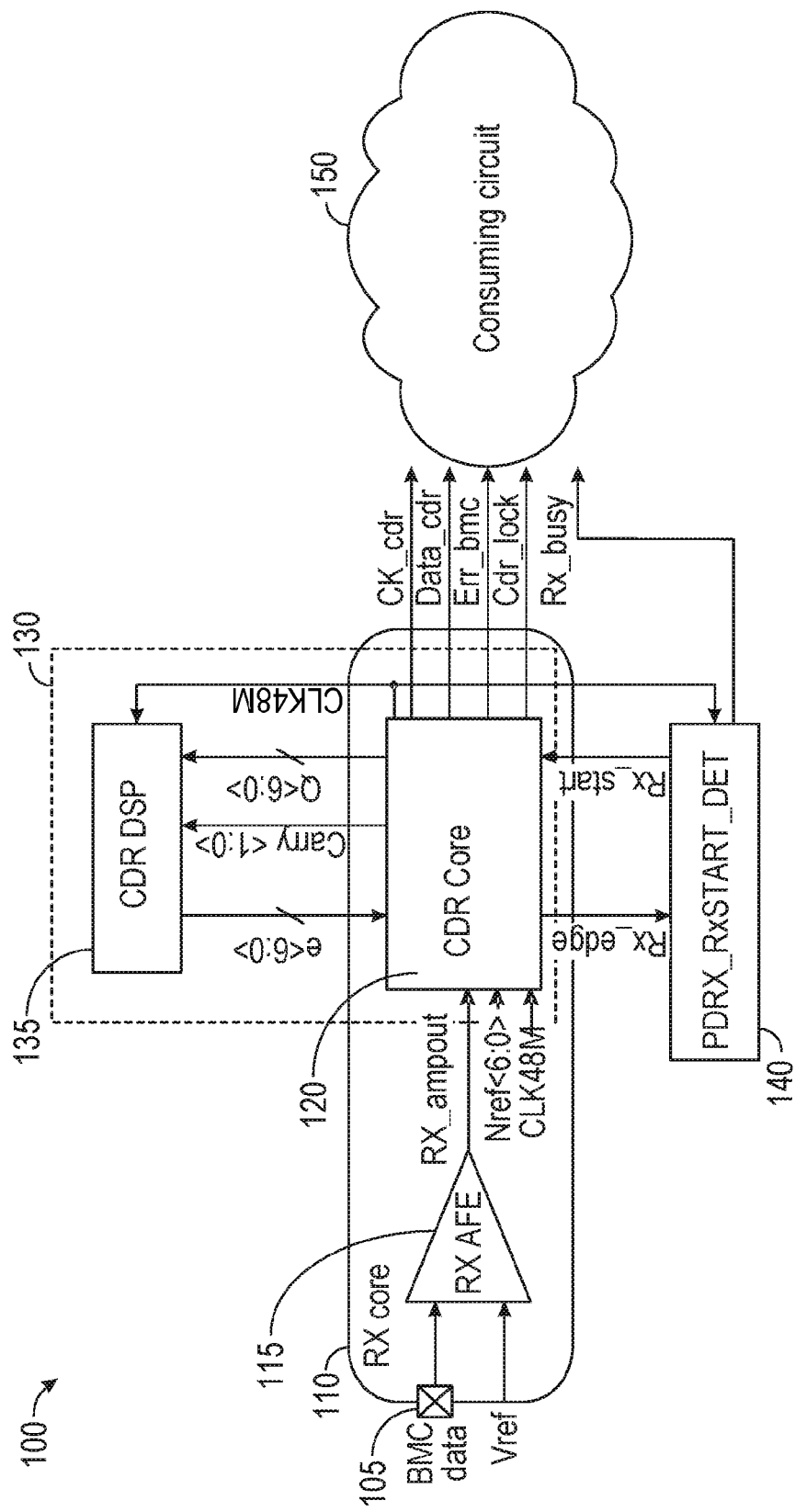
FIG. 1 is a block diagram of a high level view of a portion of a receiver in accordance with an embodiment.

Referring now to FIG. 1, shown is a block diagram of a high level view of a portion of a receiver in accordance with an embodiment. More specifically, receiver 100 may be part of a given device or component of a computing system, or component to be coupled to a given system. As an example, receiver 100 may be an integrated circuit (IC) to perform given functionality and provide a communication path with one or more other devices. One such communication path may include a USB Type-C plug, in which data and power can be communicated.

More specifically as shown in FIG. 1, data in the form of bi-phase mark coded (BMC) data can be received via an input pad 105. As seen, this incoming single-ended data is provided to a receiver core 110, itself formed of an analog front end (AFE) 115 and a clock and data recovery (CDR) circuit 130. More specifically, an embodiment of CDR circuit 130 includes digital CDR circuits 120 and 135 (namely CDR core 120 and CDR digital signal processor (DSP) 135). Various functionality may be performed within such CDR circuitry to both recover a clock signal embedded within the incoming BMC data, and recover a data portion of the communication. In this way, a recovery clock signal (CK_cdr) and underlying data (Data_cdr) can be provided to a consuming circuit 150, which may be a given functional unit of the device. In addition, receiver core 110 may further provide an error signal (Err_bmc) and a clock locked signal (CDR_lock) for communication to consuming circuit 150.

As further illustrated in FIG. 1, to enable clock and data recovery, CDR circuit 120 further receives a reference clock (CLK48M). As will be described herein, this reference clock may be a given system clock signal of device 100 and may be provided without any particular accuracy. In addition, a reference count value is also received by CDR circuit 120. As will be described herein, a reference count value (Nref<6:0>) may be set at a predetermined value. This predetermined value may correspond to a ratio between a clock signal at which the incoming BMC data is received (which in an embodiment may be at a rate of 600 kilohertz (KHz)) and the corresponding system clock signal (which in an embodiment may be at 48 megahertz (MHz)). As such, in one embodiment this reference value may be predetermined and fixed at a value of 80 (and as seen may be communicated as a 7 bit value). In one embodiment, this reference count value can be received, e.g., from firmware that executes in receiver 100.

In a particular embodiment for use with USB Type-C interconnects, understand that input pad 105 may couple to a configuration channel (CC) of the USB plug/receptacle, over which an initial power relationship between devices can occur. And, via a power delivery negotiation such as entry into a USB Power Delivery Explicit Contract, also occurring via this channel, the devices can establish management of power delivery, including the power roles of the different devices (e.g., neutral, sink and/or source), the power level of power delivery to be communicated (e.g., in terms of current (Amperes)), downstream facing port (DFP) and upstream facing port (UFP) role swap, change of port sourcing a bus voltage (VBUS), change of port sourcing Vconn, and communication with cables.

As further illustrated, receiver 100 also includes a digital RX start detection circuit 140 which may communicate a receiver start signal (Rx_start) to CDR 120 responsive to RX_edge, which provides short pulses at the rising and falling edges of AFE output 115 (RX_ampout). As further illustrated, RX start detection circuit 140 receives an edge triggered signal (Rx_edge) from CDR circuit 120. RX start detection circuit 140 further communicates a receiver busy signal (Rx_busy) to consuming circuit 150. Understand while shown at this high level in the embodiment of FIG. 1, many variations and alternatives are possible.

As will be described herein, CDR circuit 130 may provide clock and data recovery in an efficient manner, with reduced power consumption and reduced area for the circuitry. Still further, embodiments of receiver CDR circuit 130 can perform clock and data recovery in a noisy signal environment with an open loop configuration, while ensuring that the received clock can be recovered with high accuracy.

Figure 2:
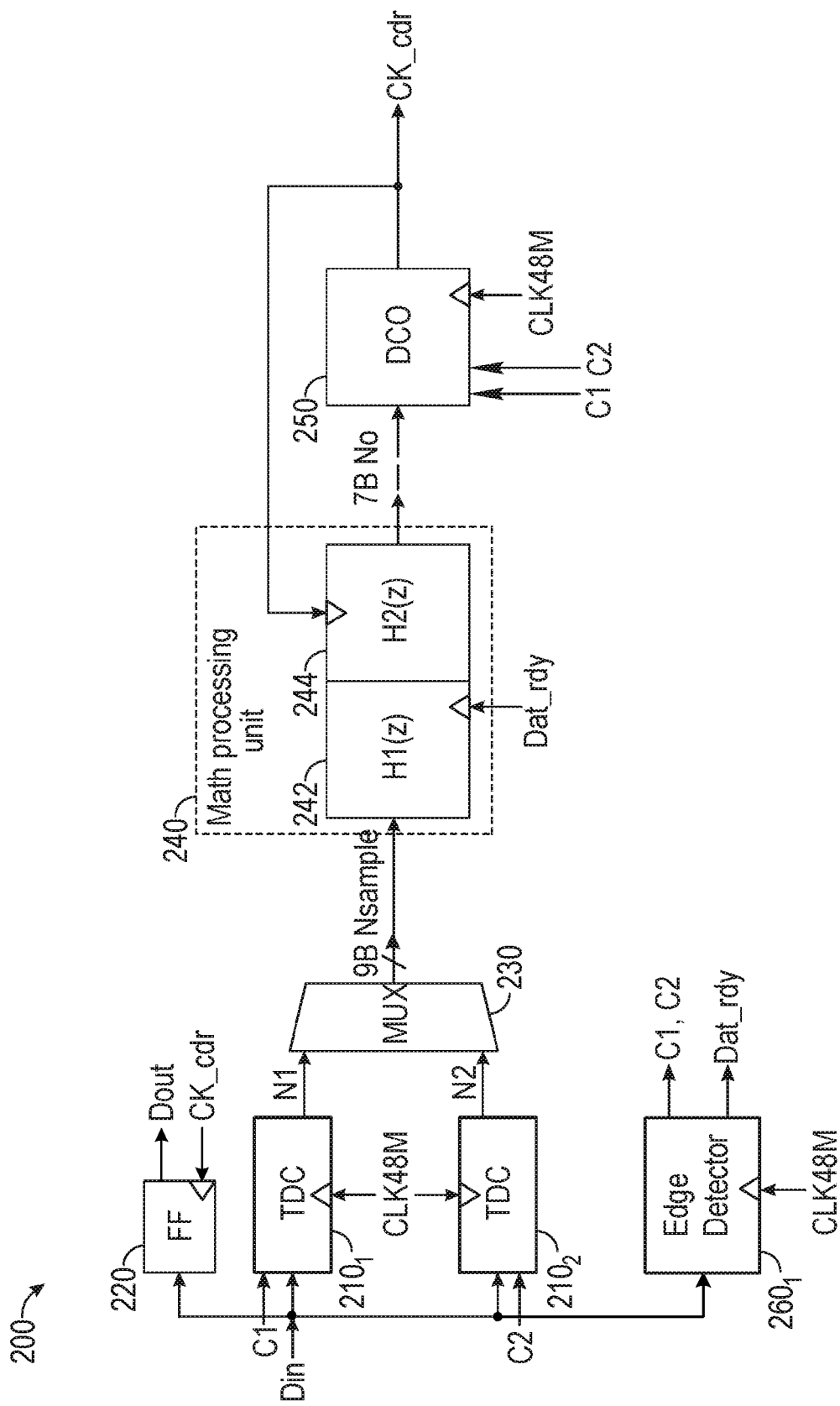
FIG. 2 is a block diagram of a portion of a CDR circuit in accordance with an embodiment.

Referring now to FIG. 2, shown is a block diagram of a portion of a CDR circuit 130 in accordance with an embodiment. More specifically circuit 200 shown in FIG. 2 is at least a portion of a digital portion of CDR circuit. As illustrated, the incoming data (Din) is received, e.g., via an off-chip source, such as a given pin of an IC coupled to a USB Type-C connector. In turn, this incoming data is received in circuit 200 from an AFE, such as AFE 115 of FIG. 1. As illustrated, this incoming data, having an embedded clock therein, is provided to a pair of time-to-digital converters (TDCs) $210_1$, $210_2$. Each of these TDCs 210 can be configured to perform a time-to-digital conversion based on a respective edge in the incoming data stream. Namely, TDC $210_1$ is configured as a positive edge detection-based converter, while TDC $210_2$ is configured as a negative edge detection-based converter.

As illustrated, each TDC 210 is configured to receive an incoming clock signal, which may be the received system clock signal, which in an embodiment operates at 48 MHz. As further illustrated, the incoming data is also provided to a data sampler 210, which in an embodiment may be implemented as a D-type flip-flop, to sample and output the recovered data (Dout). In this way, recovered data may be provided to one or more locations within the receiver. As seen, sampler 220 is configured to be clocked by the recovery clock signal (CK_cdr) recovered from the incoming data. In general, TDCs 210 are each configured to perform counting for a duration determined based on an edge detected in the incoming data. Each TDC 210 is configured to generate a count value respectively, corresponding to a difference between a predetermined value and the accumulated count value within the TDC for a given data sample.

This count value is provided through a selection circuit 230, which in an embodiment is implemented as a multiplexer, to a math processing unit 240 (which in an embodiment may be a portion of CDR DSP 135 of FIG. 1). More specifically, this value may be passed as a 9 bit value (Nsample) (formed of Q<6:0> and Carry<1:0> as in FIG. 1). As seen, this value is provided to math processing unit 240. In the embodiment shown, math processing unit 240 in FIG. 2 includes a first filter 242 (H1(z)) and a second filter 244 (H2(z)). First filter 242 may be controlled differently depending upon the type of incoming data. As will be described herein, when incoming data is of a predetermined value, such as preamble information, first filter 242 may be configured as a fifth-order finite impulse response (FIR) filter, clocked by a data ready signal (Dat_rdy) received from an edge detector 260. This configuration is used in preamble mode as all values in both one bit duration and two bit duration are taken in for fast frequency tracking. Since every consecutive six samples are DC balanced, first filter 242 is configured as a fifth-order FIR in this case. As seen, edge detector 260 provides the asynchronous short pulses C1 and C2 at the rising and falling edge of Din, respectively and also provides dat_rdy which is the synchronous pulse at edges of Din with CLK48M. Instead, when data having an unknown value is received (namely normal data) first filter 242 may be configured as a third-order FIR filter in this case. This configuration is used for random data as the values in one bit duration are only taken in for frequency tracking. Since every consecutive four samples of one bit duration are DC balanced, first filter 242 is configured as a third-order FIR. As described below, pulses C1 and C2 are used to reset asynchronously TDC $210_1$ and $210_2$ respectively before the next counting operations.

In both cases of data, namely whether the incoming data is preamble information or unknown data, second filter 244 may be configured as a low pass filter (LPF) such as a first-order infinite impulse response (IIR) filter to further smooth the output of filter 242. As such, the output of math processing unit 240 is an average of a frequency of the incoming data, which may be provided as a 7-bit value (No) to a digitally controlled oscillator (DCO) 250. Note that the initial output of processing unit 240 is configured to be Nref. As seen, DCO 250 is clocked with the system clock signal and may be configured to output the recovery clock signal CK_cdr, which as seen may be provided to clock second filter 244. As further illustrated, it is this recovered clock signal that is used to sample the incoming data in sampler 220. Although shown at this high level in the embodiment of FIG. 2, many variations and alternatives are possible.

Figure 3:
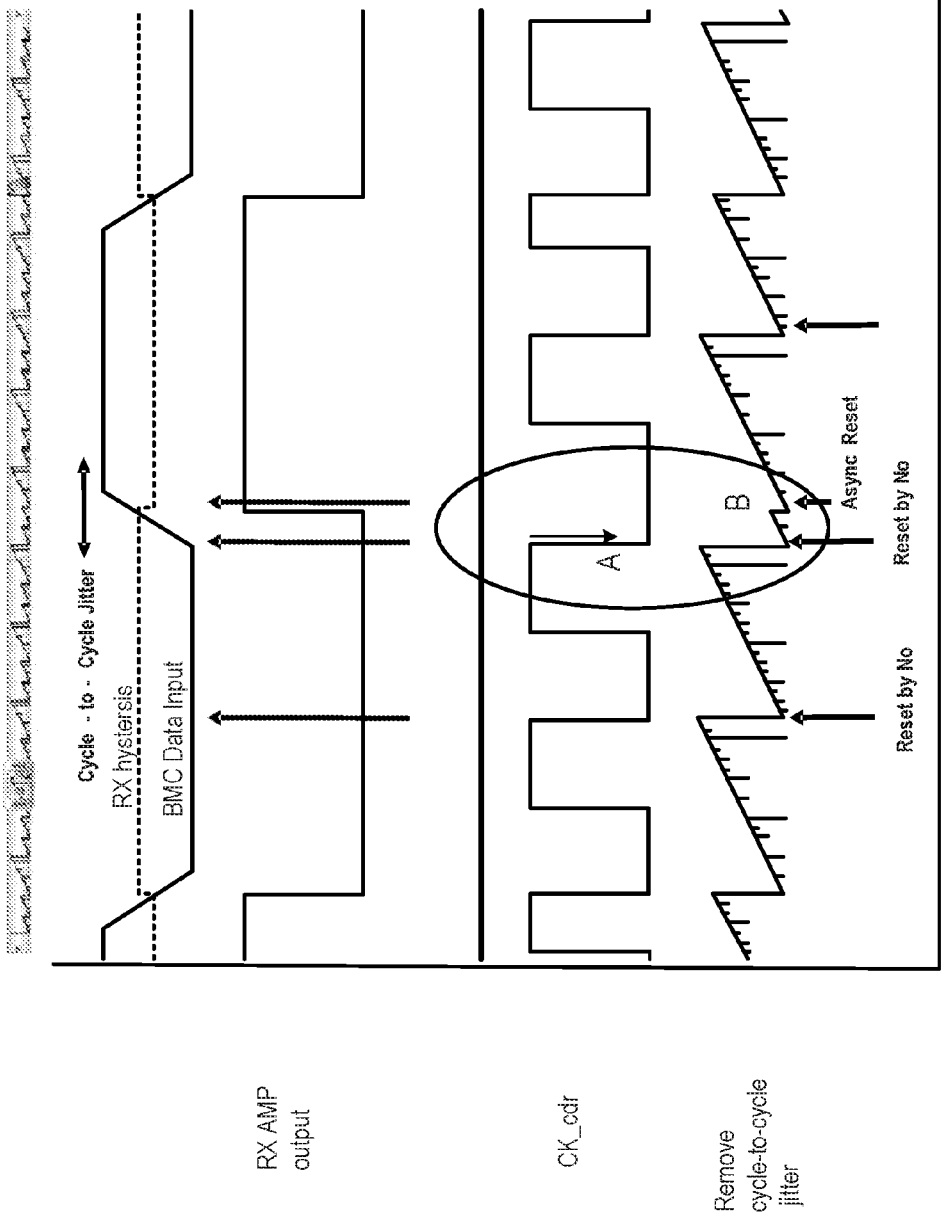
FIG. 3 is a graphical illustration of an asynchronous reset in accordance with an embodiment.

The period of DCO 250 is defined by No. The start/reset of each DCO clock is set by the asynchronous resets C1 or C2, or by reaching the value of No. The rising edge of the DCO clock is fixed at No/2. Since the cycle-to-cycle jitter and BMC frequency and ground shifting occur, the falling edge of DCO clock is purposely designed to remove them before receipt of the next BMC data. Referring now to FIG. 3, shown is a graphical illustration of an asynchronous reset in accordance with an embodiment. As shown in FIG. 3, a longer BMC data period T+ΔT is present. After the falling edge A triggered by No, DCO 250 operates to recount the extra period ΔT at point B. If ΔT is less than No/2, the rising edge will not come out. When the asynchronous reset occurs before No/2, this extra period is eliminated before receipt of the next BMC data. As a result, no DCO clock misalignment occurs. The protection margin is slightly less than No/2. In this way, fast phase tracking is achieved.

Figure 4A:
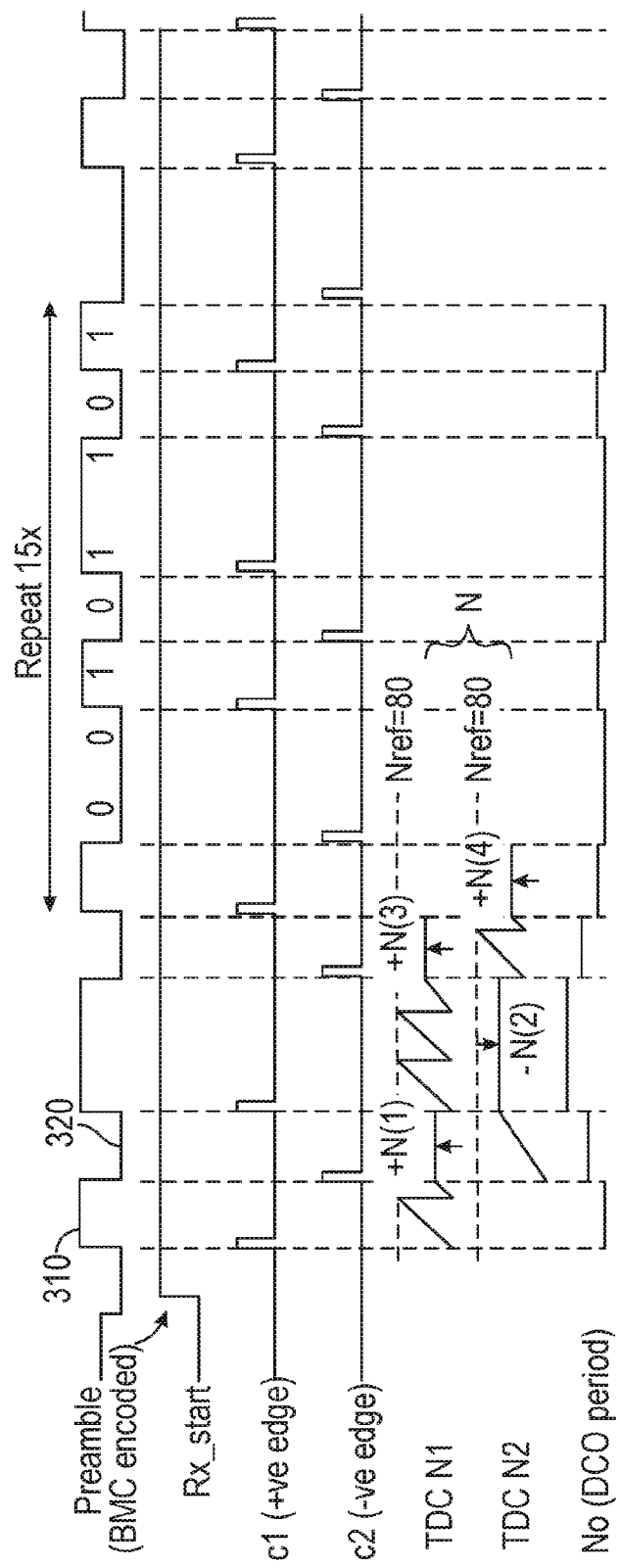
FIG. 4A is a preamble timing diagram illustrating operation of a CDR circuit in accordance with an embodiment.

Referring now to FIG. 4A, shown is a timing diagram illustrating operation of a CDR circuit in accordance with an embodiment. As illustrated in FIG. 4A, the timing diagram shows operation of the CDR circuit when an incoming data stream is preamble data that is BMC encoded. As illustrated, the preamble data may be provided as a repeating stream (e.g., 15 times, in one embodiment) to enable receiver locking operations to be performed. For a USB Type-C port, this preamble data may be a repeating string of logic 0 and logic 1 values, some of which are multiple (2) bit durations and some of which are single bit durations. Note that in an embodiment, a unit interval (UI) for two bits of information may be approximately 3.3 microseconds (μs) with a half UI being half that value. Note that with a system clock signal of 48 MHz, this corresponds to a unit interval of approximately 20 nanoseconds (ns). As illustrated, operation during this preamble receipt begins with a start signal (Rx_start) generated by detection circuit 140. Next, edge triggered pulses, namely a first edge pulse train C1, is generated by a positive edge detector present in detection circuit 260. As illustrated, this edge detector for first TDC $210_1$ may generate pulses (as illustrated in waveform C1) responsive to detection of rising edges within the preamble. In an embodiment, such edge detector may be implemented as a monostable multivibrator or one-shot circuit. Of course other implementations of an edge detector are possible. In turn, a negative edge detector present in detection circuit 260 is used to generate pulses for a second TDC $210_2$ (as illustrated in waveform C2) responsive to detection of falling edges within the preamble.

Still referring to FIG. 4A, the timing illustration further shows counting operations that are performed in opposite phases by the two TDCs. Namely a first TDC (e.g., TDC $210_1$ in the embodiment of FIG. 2) that is triggered by the positive going edges counts a duration of such positive data samples within the preamble. In turn, a second TDC (e.g., TDC $210_2$ in the embodiment of FIG. 2) that is triggered by the negative edges counts a duration of such negative data samples within the preamble. As seen, such counters may be configured to count to a maximum count value defined by Nref (which in an embodiment may be a 9 bit counter to count to a maximum value of 511. In other cases Nref may be set to 55 or 80 or 111 or 127. Thus during a first data sample 310, a first TDC counts to Nref, and then is reset and continues counting, until a transition occurs in the preamble, at which point a second TDC begins counting a second data sample 320.

Note that during this second phase of operation when the second TDC is actively counting, the first TDC holds its count value (N1) from first data sample 310 (and with reference back to FIG. 2, outputs such value through selection circuit 230 to math processing unit 240). And the second TDC operates in opposition to the first TDC to count and hold a count value (N2). As such, there are two parallel TDCs that count the respective successive data periods. As will be described herein, the count values provided by both TDCs (both for one-bit duration samples as well as for two-bit duration samples (namely N)) are processed downstream for fast frequency tracking during preamble processing.

As further illustrated in FIG. 4A, the resulting DCO period varies for each data sample, but quickly tracks to a relatively minimal amount of jitter or phase change. Understand while shown with these particular examples and illustrated timing in FIG. 4A, many variations and alternatives are possible.

Figure 4B:
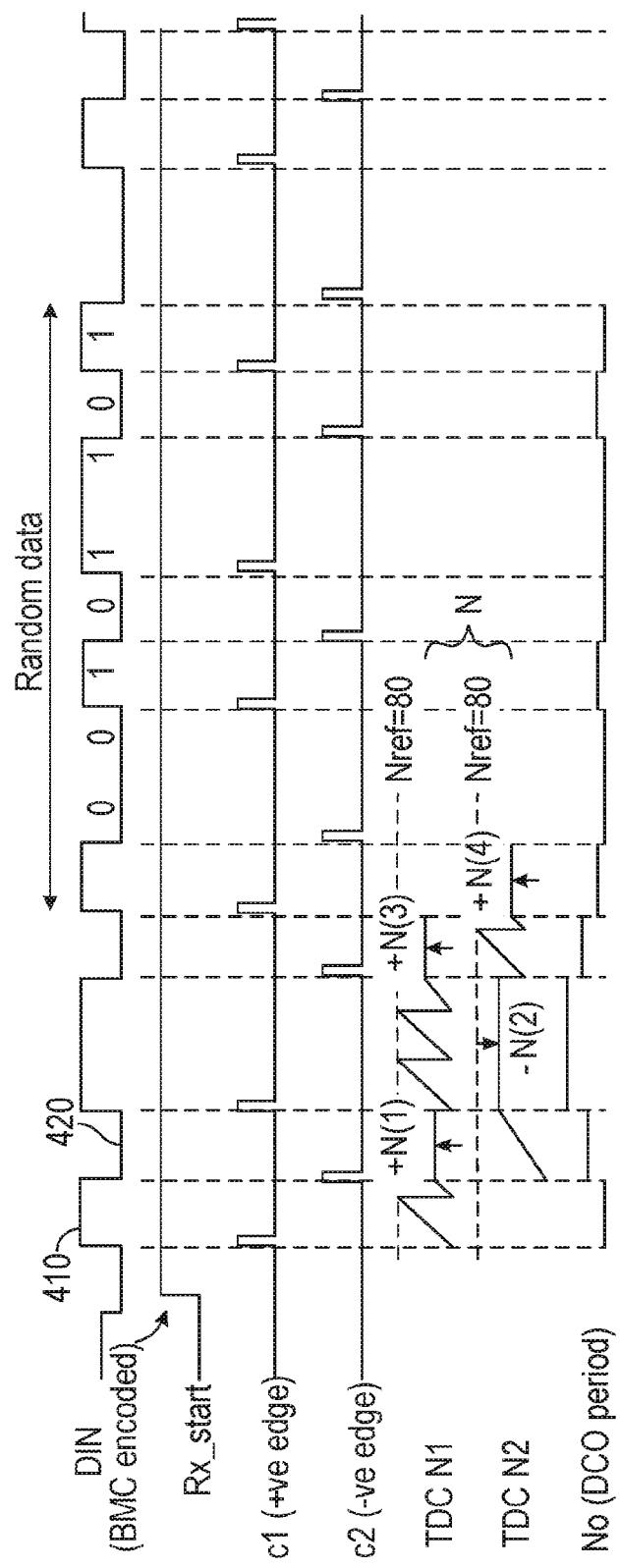
FIG. 4B is a data timing diagram illustrating operation of a CDR circuit in accordance with an embodiment.

Referring now to FIG. 4B, shown is a timing diagram illustrating operation of a CDR circuit in accordance with another embodiment. As illustrated in FIG. 4B, the timing diagram shows operation of the CDR circuit when an incoming data stream is a regular data portion of a BMC encoded message. As such this data is assumed to be random data, in contrast to the predetermined repeating preamble stream. Operation may proceed the same as described above as to FIG. 4B for incoming data such as data samples 410 and 420. Note however, that for this random data, only single bit duration errors are processed for frequency tracking here.

Figure 5:
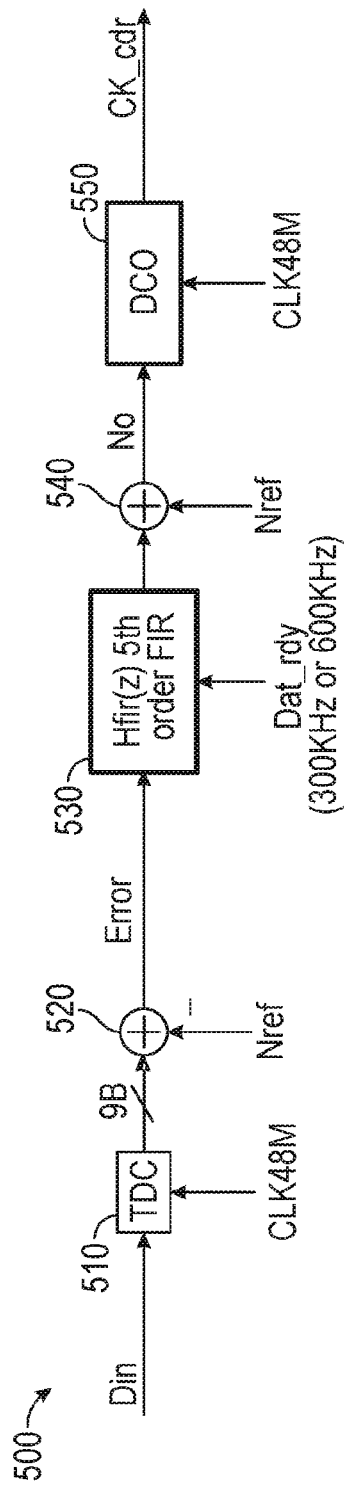
FIG. 5 is a block diagram of a receiver circuit in accordance with another embodiment.

Referring now to FIG. 5, shown is a block diagram of a receiver circuit in accordance with another embodiment. More specifically, receiver circuit 500 of FIG. 5 shows an open loop configuration for a digital CDR architecture as described herein. Incoming data (as provided via an analog front end) is received in a TDC 510. Understand that TDC 510 may include multiple separate TDCs that operate out of phase with each other. Specifically in one embodiment two such TDCs may be provided, each of which operates to independently sample and hold different portions of the incoming data. As illustrated, TDC 510 may be clocked by a given system clock signal (e.g., a 48 MHz clock signal in an embodiment). As illustrated, TDC 510 outputs duration information, e.g., in the form of a count value, such as a 9-bit count value. This count value is provided to an adder 520 that may be configured to subtract a reference count value, Nref. In an embodiment, Nref equals 80. As such, the output of adder circuit 520 is an error signal corresponding to a deviation from a predetermined ratio (of system clock signal to recovery clock signal). This error signal is then filtered in a filter 530. In various embodiments, a single configurable filter is provided, which may be dynamically configured with different orders depending on whether the incoming data is preamble information or unknown data. In other cases, in addition to a configurable FIR filter, an additional IIR low pass filter may further filter the output of the FIR filter. As illustrated, filter 530 may be clocked by a given clock signal. In an embodiment, this Dat_rdy clock signal may correspond to a synchronization of the edge detection pulses synchronized to the system clock signal with a 2 Tck delay. In an embodiment, filter 530 may receive a predetermined number of samples for DC balance in BMC coding. Filter 530 filters out the jitter/noise at a frequency of this clock signal divided by number of samples. The filtered output is provided to another adder circuit 540, which may similarly be configured to add the predetermined reference value, such that a value No corresponding to a clock period is provided to a digitally controlled oscillator 550 (similarly clocked by the system clock signal), such that the resulting output is the clock recovery signal (CK_cdr). As such, DCO 550 operates using No as the receiver recovery clock period.

Figure 6:
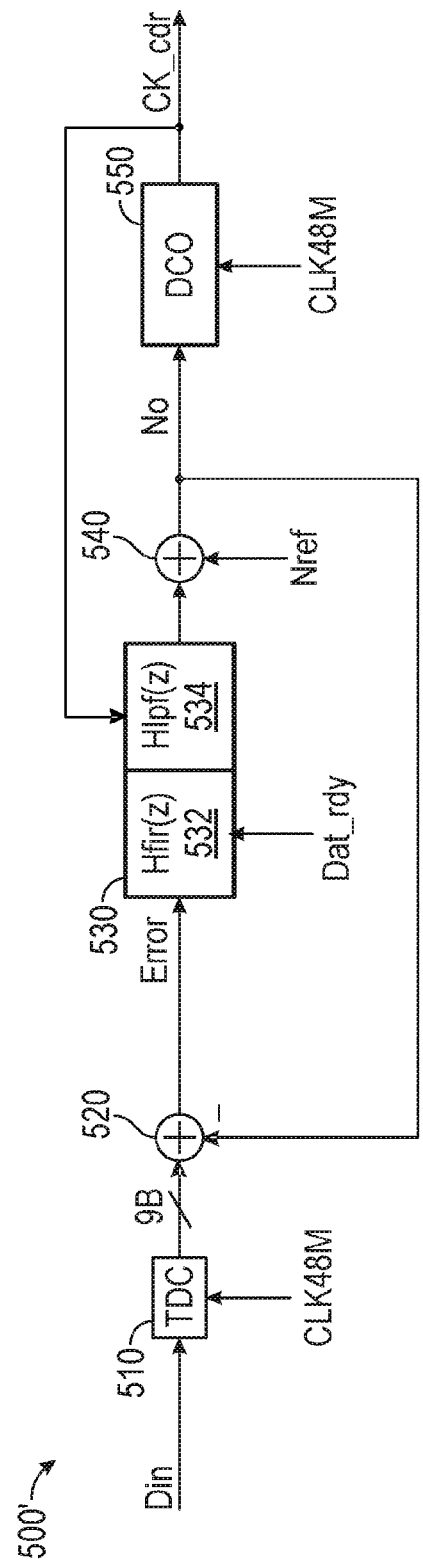
FIG. 6 is a block diagram of a receiver circuit in accordance with another embodiment.

In other embodiments, a digital CDR architecture may provide a closed loop configuration. Referring now to FIG. 6, shown is a block diagram of a receiver circuit in accordance with another embodiment. As shown in FIG. 6, receiver 500' may be implemented similarly as in FIG. 5. However, note that FIG. 6 details a closed loop architecture. Furthermore, note details regarding filter 530, which is formed of multiple independent filters, namely a first FIR filter 532 and a first order low pass filter 534. The other components may be the same as in FIG. 5. However, note that instead of receiving a predetermined reference value in adder circuit 520, a feedback value, No, is provided from the output of adder circuit 540 back to adder circuit 520 to enable determination of the error signal to be provided to filter 530. And the resulting recovery clock signal may be used to clock low pass filter 534 for accumulation and filtering. By using previous and current samples for this calculation of the recovery clock period, if there is a sudden interference, filter 530 may efficiently remove such interference. Understand while shown at this high level in the embodiment of FIG. 6, many variations and alternatives are possible.

Figure 7:
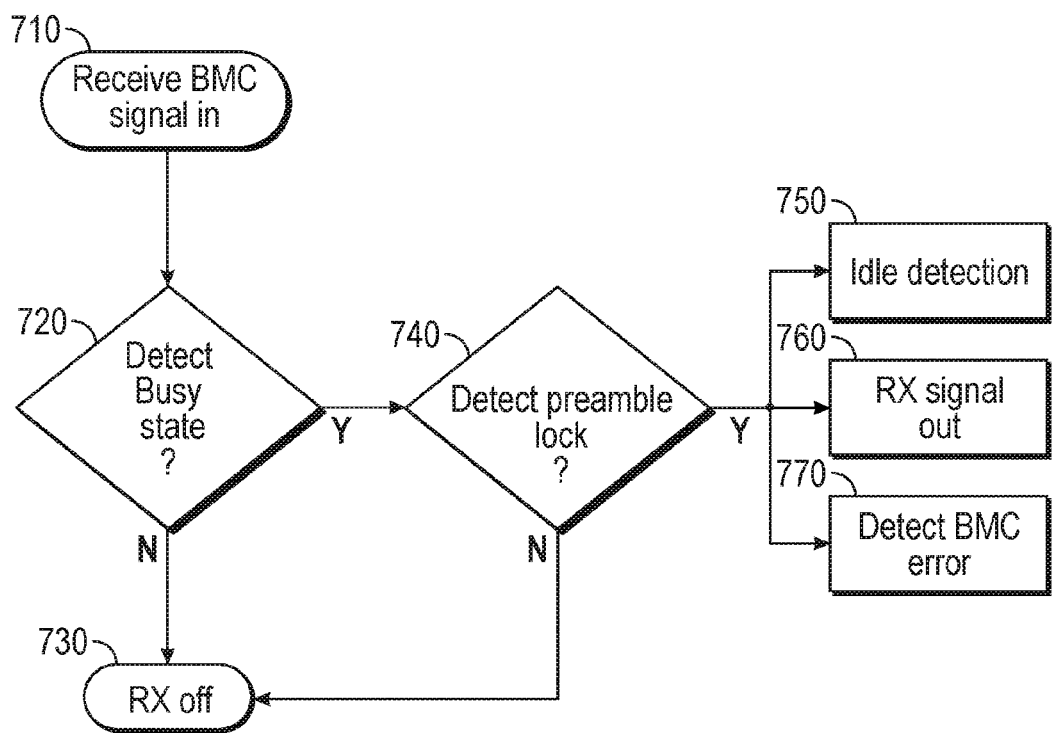
FIG. 7 is a flow diagram of a method for activating a receiver in accordance with an embodiment.

Referring now to FIG. 7, shown is a flow diagram of a method for activating a receiver in accordance with an embodiment. As shown in FIG. 7, method 700 may begin by receiving a BMC signal (block 710). As described above, this signal is received within a chip or other component and provided through an AFE that detects a logic level of the signal. Next at diamond 720 it is determined whether a busy state is detected. In an embodiment, this determination may be based on three triggers within a fixed window, according to a first timer value. In one embodiment, this timer value may correspond to a duration, which can be programmable to 13 microseconds (µs), 15 µs, 17 µs or 19 µs, per the USB Type-C standard. If no such trigger is detected, control passes to block 730 where the receiver may be placed into an off state.

Still with reference to FIG. 7, if a busy detection occurs, control passes to diamond 740 where it can be determined whether a preamble has locked. In an embodiment, this determination may be based on receipt of a predetermined pattern (e.g., 1101) within a fixed window, according to a second timer of programmable duration of 36 µs, 54 µs, 72 µs or 90 µs. If the preamble has locked, control passes to various branches for clock and data recovery operations. At block 760, the received signal is output as a data signal (Data_cdr) along with a recovery clock signal (CK_cdr). Still further, a CDR lock indication signal (CDR_lock) also may be output.

In parallel with this operation, it can be determined whether an idle detection has occurred (block 750). In an embodiment, this idle detection may correspond to three triggers within a moving window, which in an embodiment may be according to a third timer value of programmable to 13 μs, 15 μs, 17 μs and 19μs. Also in parallel with clock and data recovery operations it can be determined whether a data error is detected at block 770. In an embodiment, such error determination may be based on receipt of a predetermined pattern (e.g., 000 or 111) to realize noise rejection.

In some embodiments, a reference voltage used to determine a logic level of the incoming data can be dynamically controlled based at least in part on a power mode in which the Type-C port is being used. More specifically, based on BMC data communication regarding power mode handshaking, a power mode can be determined. Based at least in part on such power mode determination, a dynamically variable reference voltage level can be provided for a comparator to enable a larger data eye opening at the AFE output. Techniques may control a reference voltage to minimize the effect of ground shifting and to increase hysteresis for noise immunity in a receiver.

Figure 8:
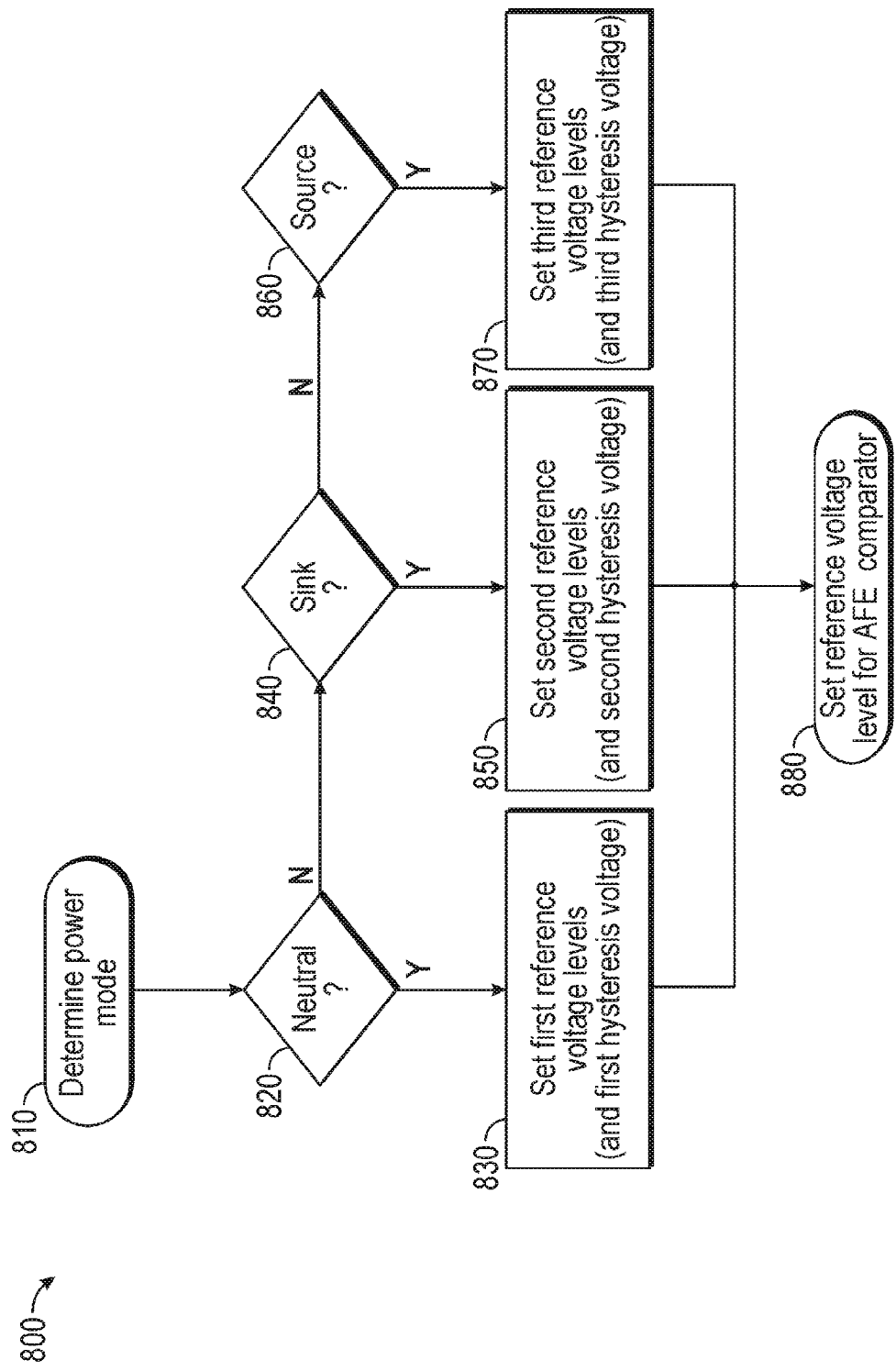
FIG. 8 is a flow diagram of a method for dynamic reference voltage control in accordance with an embodiment.

Referring now to FIG. 8, shown is a flow diagram of a method for dynamic reference voltage control in accordance with an embodiment. In an embodiment, method 800 may be performed by a controller or other circuit such as a MCU of a receiver configured to execute firmware or other instructions stored on a non-transitory storage medium. As seen, method 800 begins by determining a power mode (block 810). In an embodiment this determination may be based on BMC data communications during power mode handshaking. As illustrated, according to USB Type-C conventions, operation can be in one of multiple modes, including a neutral mode, a sink mode and/or a source mode (as determined at diamonds 820, 840 and 860). Depending upon the identified power mode, reference voltage levels (namely low and high reference voltage levels) can be selected or set for the comparator of the analog front end. In addition, by way of setting these reference voltage levels, a dynamic hysteresis voltage also may be set.

Thus as illustrated, if a neutral mode is determined, at block 830 the reference voltage levels and hysteresis voltage may be selected or set to first levels. In an embodiment, these first levels may correspond to a high reference voltage level (Vrefh) of 620 millivolts (mV) and a low reference voltage level (Vrefl) of 500 mV, realizing a hysteresis voltage of 120 mV. In an embodiment, the MCU or other control logic may access firmware-stored tables to obtain these reference voltage levels. For example, firmware may be included in a table having entries each associating a particular power mode with appropriate reference voltage levels. In some embodiments, this table may be stored as part of the firmware or in another non-volatile storage location accessible to firmware or other instructions that execute on the MCU.

After identifying such levels, control passes to block 880 where the reference voltage levels can be set for the AFE comparator. Different manners of setting such reference voltage levels may occur. In an embodiment the MCU may dynamically set these reference voltage levels by way of control of switches that connect to a string of resistors, e.g., at a reference input node of the comparator. For example, based on the determined power mode, appropriate control signals for the given reference voltage(s) can be sent to switches coupled to such a string of resistors. As one particular example, a three-bit digital code can be sent, with each bit to control a respective switch (e.g., metal oxide semiconductor field effect transistor (MOSFET)) to couple or decouple from the resistor string. Of course other manners of setting the reference voltage level such as changing a constant voltage (Vconstant) or programming a resistor string can occur in other embodiments.

Still with reference to FIG. 8, instead if operation is determined at diamond 840 to be in a sink mode, control passes to block 850 where the reference voltage levels and hysteresis voltage may be set to second levels. In an embodiment, these second levels may correspond to a high reference voltage level of 600 millivolts (mV) and a low reference voltage level of 300 mV, realizing a hysteresis voltage of 300 mV. And instead if operation is determined at diamond 860 to be in a source mode, control passes to block 870 where the reference voltage levels and hysteresis voltage may be set to third levels. In an embodiment, these third levels may correspond to a high reference voltage level of 840 millivolts (mV) and a low reference voltage level of 540 mV, realizing a hysteresis voltage of 300 mV. While described with these particular examples, understand that different settings can occur in different embodiments. For example, the different reference/hysteresis levels may instead be determined based on whether operation is only in a neutral/sink mode or a neutral/source mode. In such cases, where a determination can be made that a device is only to operate in either of neutral/sink or neutral/source modes (and not in a sink and source mode) an even larger eye opening can be realized. More specifically, in a particular embodiment, an eye opening of approximately 410 mV can be realized. To this end, when operation is in a neutral/sink mode or a neutral/source mode, reference voltage levels can be set at, respectively 600 mV or 840 mV for a high reference voltage level and 300 mV or 540 mV for a low reference voltage level. Thus in such embodiment when it is determined that a device is only operating in one of a source or sink mode, an even larger eye opening and greater noise immunity can be realized.

Figure 9:
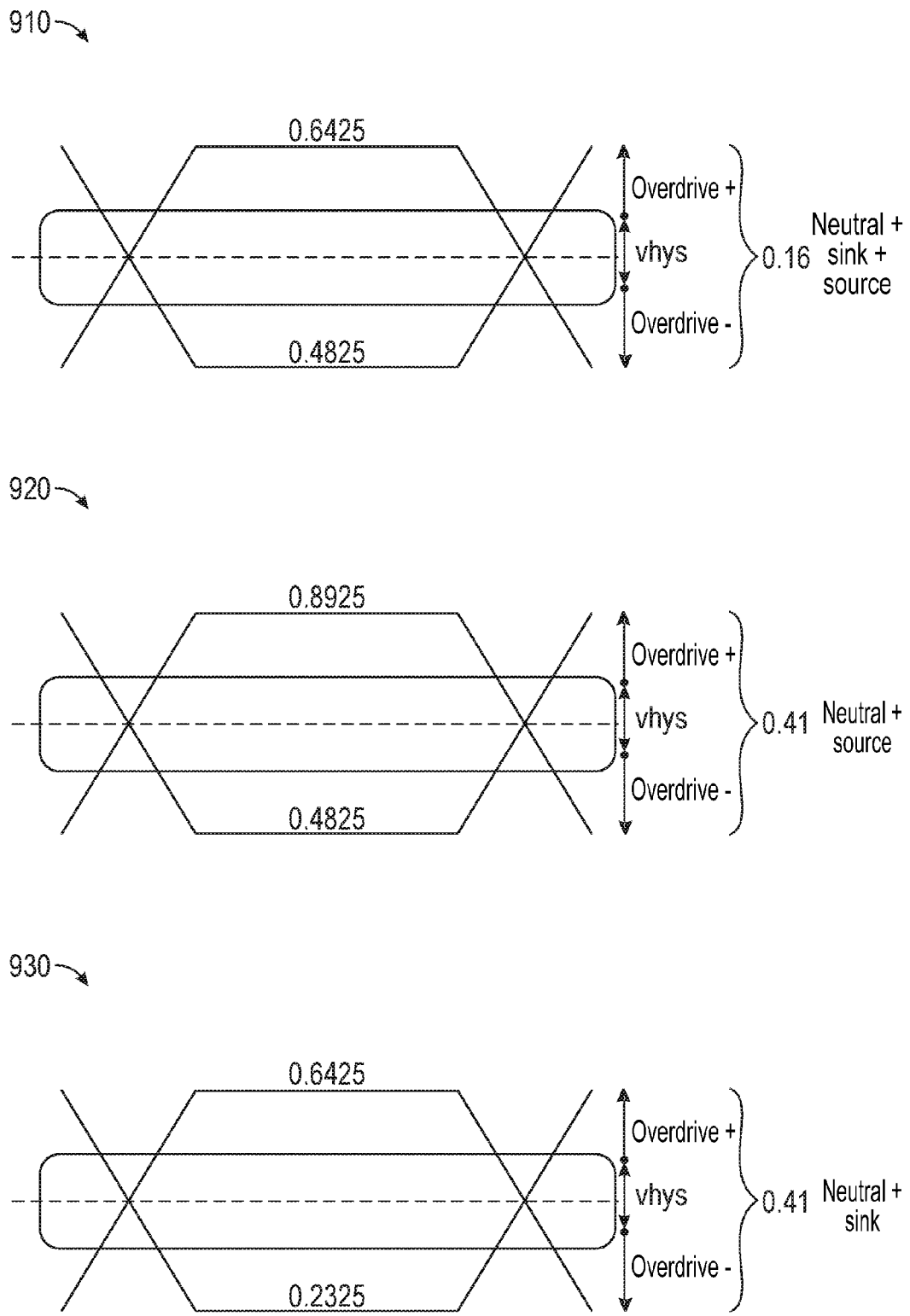
FIG. 9 are eye opening diagrams in accordance with an embodiment.

Referring now to FIG. 9, shown are eye opening diagrams, illustrating different data eye opening margins, depending on reference voltage levels. Thus as shown, representative data eyes 910, 920, and 930 are possible using different reference voltage levels based on determined power mode. As seen, a larger eye opening of approximately 410 mV can be realized for eye margins 920 and 930, when a determination of neutral/source or neutral/sink only modes is made, in contrast to the smaller eye opening 910 when a combined source/sink mode is determined.

Figure 10:
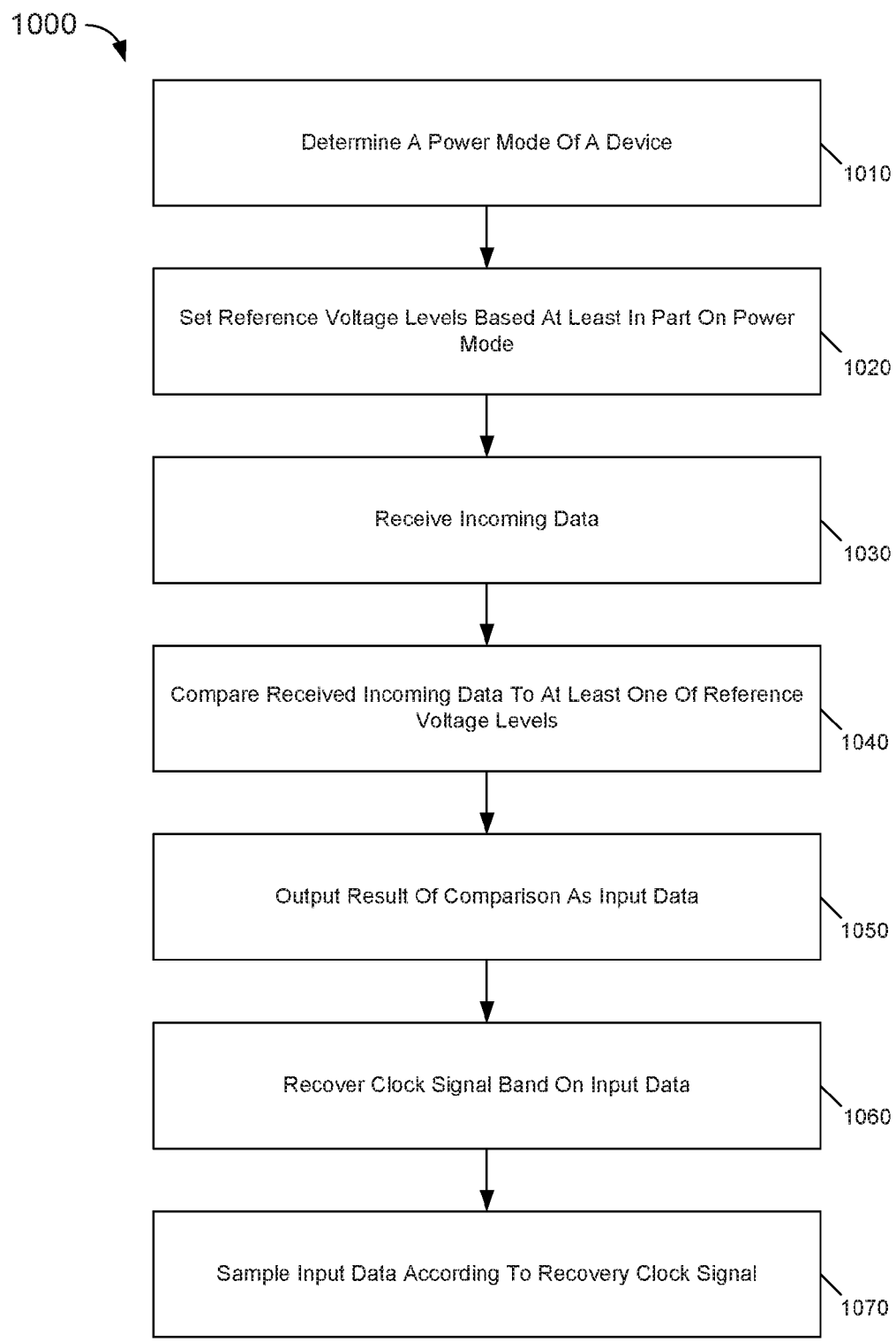
FIG. 10 is a flow diagram of a method in accordance with yet another embodiment.

Referring now to FIG. 10, shown is a flow diagram of a method in accordance with yet another embodiment. As shown in FIG. 10, method 1000 may be performed within a receiver to dynamically determine reference voltage levels for use in connection with analog front end operations, as well as to process incoming data. As seen, method 1000 begins by determining a power mode of a device (block 1010). In some embodiments, such power mode determination may be based on BMC data communicated according to a USB Type-C convention during a power mode handshaking process. This power mode determination may establish the device as being in a neutral power mode, a source power mode, a sink power mode, or combinations thereof. Based at least in part on this determined power mode, reference voltage levels can be set (block 1020). For example, a lookup table can be accessed to identify high and low reference levels (along with a corresponding hysteresis voltage) for the identified power mode. These reference voltage levels can be provided to the analog front end, e.g., as a control code for a voltage value to be provided to a comparison input of a comparator. At this point the device is configured for the given power mode to improve operation with greater data eye margin at potentially reduced power consumption levels.

Thus method 1000 further shows operations performed during normal operation. More specifically at block 1030 incoming data may be received, e.g., in the AFE. The AFE includes a comparator to perform a comparison of this received incoming data to at least one of these multiple reference voltage levels (block 1040). For example, when incoming data is of a logic high level, the reference voltage level may be the low reference voltage level, such that the comparison output remains at a logic high until the incoming data drops below this low threshold, affording a measure of hysteresis. Alternately, when the incoming data is a logic low level, the reference voltage level may be set to the high reference voltage level, such that the comparator continues to output a low voltage level until the incoming data exceeds the high reference voltage level. At block 1050, the comparator outputs the result of the comparison as input data.

Still referring to FIG. 10, at block 1060 a clock signal can be recovered based on the input data. As described herein a CDR digital architecture can be used to recover this clock signal in a reduced complexity manner. Finally, at block 1070 the incoming data can be sampled according to this recovery clock signal, e.g., in a data sampler. Of course understand that additional operations may be performed on the incoming data within a consuming logic that receives the data samples from the data sampler.

Figure 11:
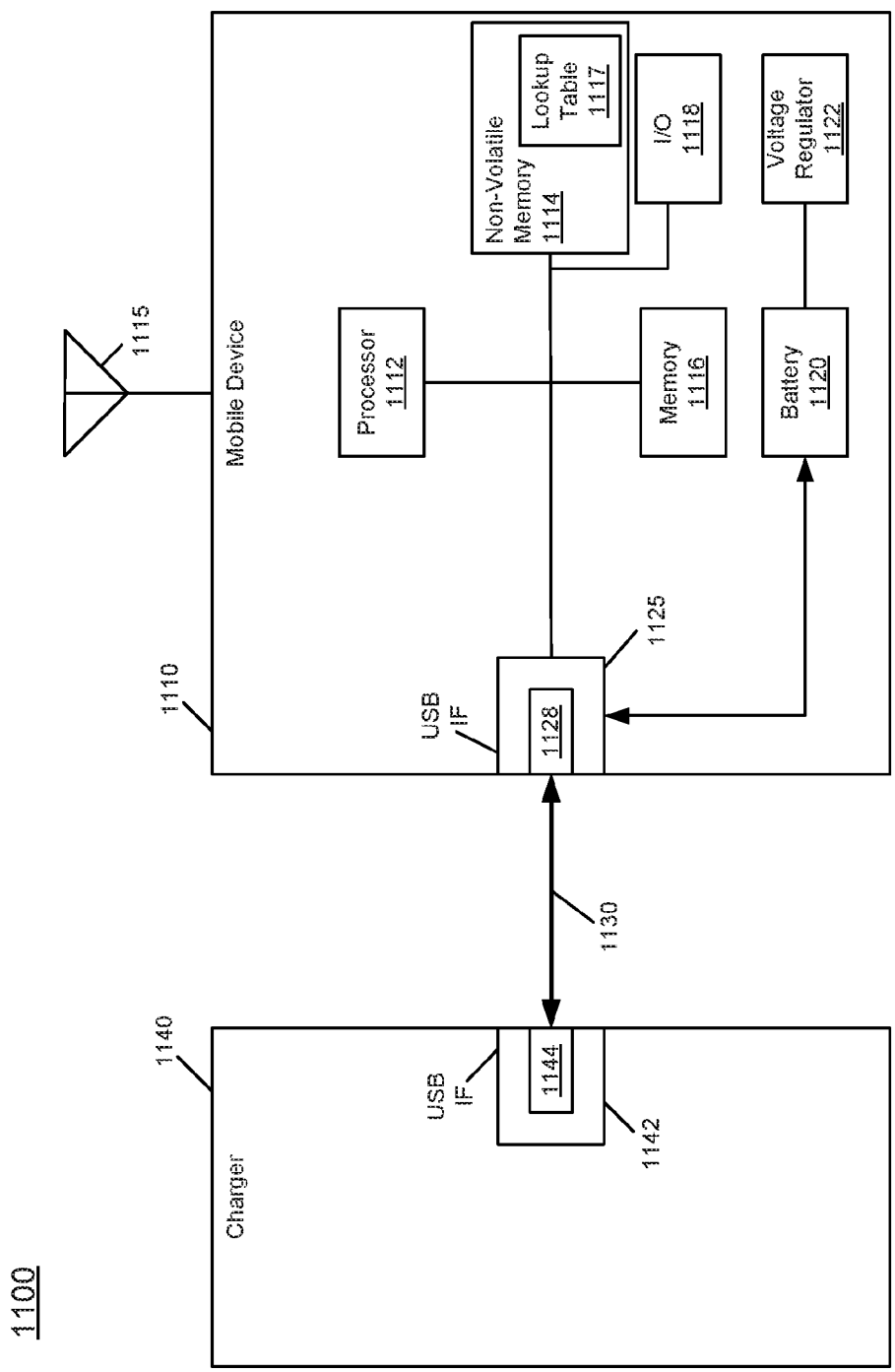
FIG. 11 is a system implementation incorporating a USB Type-C connection technique in accordance with an embodiment.

Referring now to FIG. 11, shown is a system implementation incorporating a USB Type-C connection technique in accordance with an embodiment. As shown in FIG. 11, a system 1100 includes a mobile device 1110, such as a smartphone, tablet computer, laptop computer or so forth that includes a USB-Type C port. As such, via this port, a USB Type-C cable 1130 can couple mobile device 1110 to a charger 1140. Understand that charger 1140 may be a standalone charger, or may be another system that can provide charging capability, such as a laptop computer, desktop computer or so forth.

To enable interconnection and communication of BMC data, charger 1140 includes a USB interface circuit 1142, while mobile device 1110 includes a USB interface circuit 1125, which in this embodiment is implemented as a USB Type-C port. As seen, each of these interface circuits includes a corresponding CDR in accordance with an embodiment, namely CDRs 1144 and 1128, respectively. As such, efficient, low power clock and data recovery can occur in these devices as described herein.

As further illustrated in FIG. 11, mobile device 1110 includes at least one antenna 1115 to enable communication, e.g., via a cellular network or other wide area wireless network, a wireless local area network, and/or a global positioning satellite system and so forth. In addition, mobile device 1110 includes a processor 1112, which may be any type of general-purpose processor, system on chip or so forth. As seen, processor 1112 couples to a memory 1116, a non-volatile memory 1114, such as a flash storage or other non-volatile memory, and an input/output circuit 1118, which in an embodiment may be implemented at least in part via a touch screen display.

As illustrated, non-volatile memory 1114 may include a lookup table 1117. As described herein, lookup table 1117 may be configured with a plurality of entries, each to store reference voltage levels for a corresponding power mode in which the device may be active. As such, firmware that executes, e.g., on processor 1112 may access this lookup table based on a determination of the active power mode to obtain reference voltage levels for application to an AFE comparator, as described herein. Note that in one specific embodiment, each entry may store multiple control codes (e.g., one for each of high and low reference voltage levels), where each control code is used to control a programmable resistance or other control mechanism to enable the comparator to operate with the given reference voltage level. As further shown, when power delivery is from charger 1140 to mobile device 1110, a charging current can be applied to a battery 1120 that in turn powers mobile device 1110 via an internal voltage regulator 1122.

Figure 12:
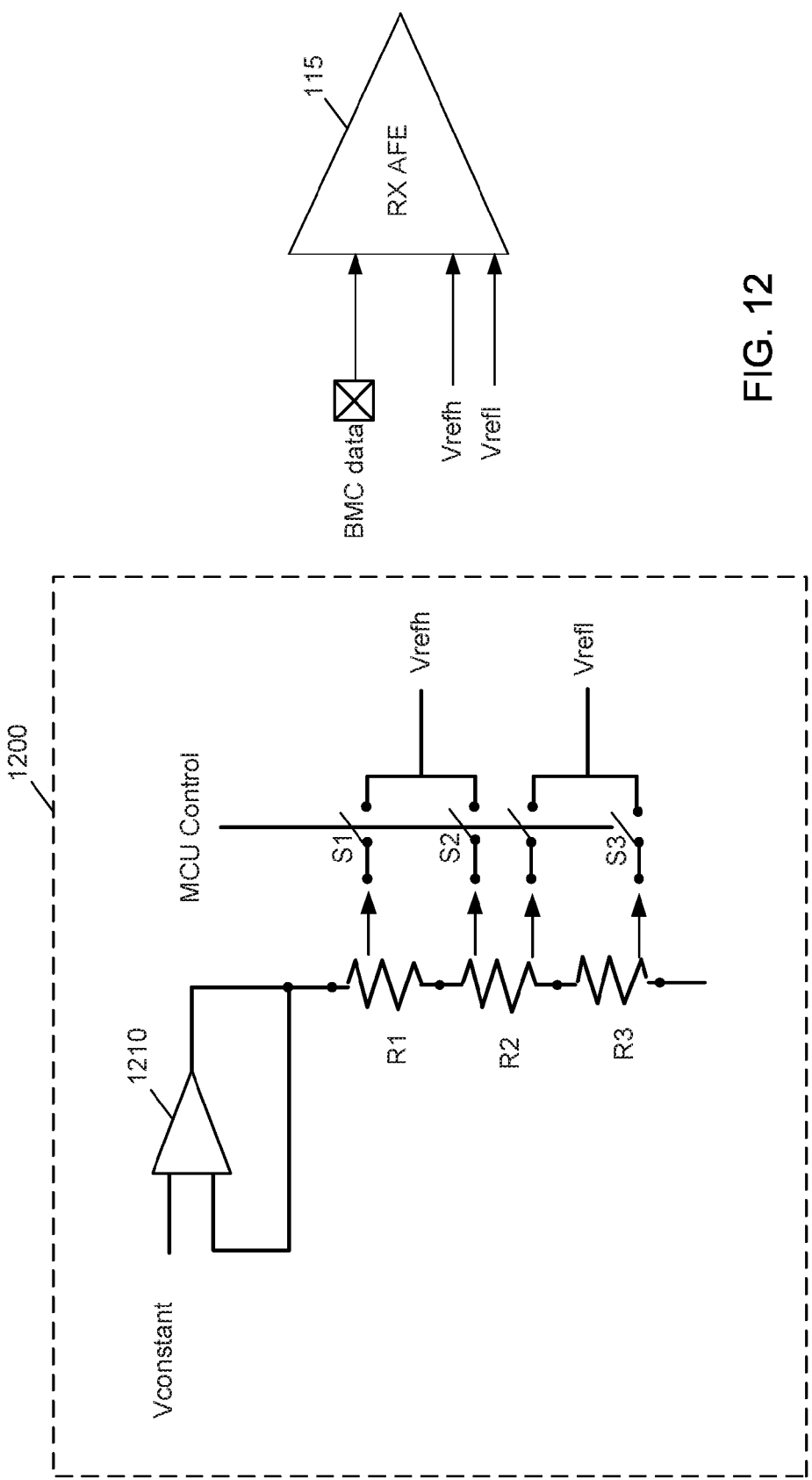
FIG. 12 is a block diagram of an example reference voltage generator in accordance with an embodiment.

Referring now to FIG. 12, shown is a block diagram of an example reference voltage generator in accordance with an embodiment. As shown in FIG. 12, generator 1200 may be used to generate controllable reference voltages (both Vrefh and Vrefl). As illustrated, voltage generator 1200 includes an amplifier 1210 to receive a predetermined voltage (Vconstant, which may be set at a voltage of 1.2 volts) at a first input node. Based on feedback provided to a second input node of amplifier 1210, this voltage is provided to a resistor string formed of resistors R1-R3. In turn, each of these resistors may be programmably switched to couple to reference voltage nodes (Vrefh and Vrefl) by way of controllable switches S1-S3, which as discussed above may be implemented as MOSFETs. In this embodiment, control bits from an MCU may be used to control the gates of such MOSFETs to couple or de-couple resistors of the resistor string. As further illustrated in FIG. 12, these reference voltages may be provided to a front end comparator, such as comparator 115 of FIG. 1 (also shown in FIG. 12, receiving the reference voltages from reference voltage generator 1200). While described with this particular implementation, understand that other implementations are possible in other embodiments.

Understand that the various operations described above to configure and operate a reference-less CDR may be realized using instructions stored in a non-transitory storage medium that when executed enable a microcontroller or other control logic to configure and operate the CDR as described herein. While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A non-transitory computer-readable medium including instructions that when executed enable a system to perform operations comprising:

performing a power mode negotiation with a device coupled to the system, the system comprising a receiver;

determining a power mode for the receiver based at least in part on the power mode negotiation;

accessing an entry of a table based on the determined power mode and obtaining at least one control code stored in the entry; and controlling at least one circuit element to provide a selected reference voltage level to a reference input node of a comparator of the receiver based on the at least one control code.

2. The non-transitory computer-readable medium of claim 1, further comprising instructions that when executed enable the system to perform operations comprising:
controlling the at least one circuit element to provide a first reference voltage level to the reference input node based on a first control code when incoming data received in the comparator is a first logic level; and
controlling the at least one circuit element to provide a second reference voltage level to the reference input node based on a second control code when the incoming data received in the comparator is a second logic level.

3. The non-transitory computer-readable medium of claim 2, wherein controlling the at least one circuit element comprises controlling a plurality of switches coupled to a plurality of resistance elements based on one of the first control code and the second control code.

4. The non-transitory computer-readable medium of claim 1, further comprising instructions that when executed enable the system to perform operations comprising:
receiving incoming data in the receiver;
oversampling a first duration of the incoming data in a first time-to-data converter (TDC) and holding the oversampled first duration during receipt of a second duration of the incoming data;
oversampling the second duration of the incoming data in a second TDC and holding the oversampled second duration during receipt of a third duration of the incoming data; and
generating a recovery clock signal in a digitally controlled oscillator (DCO) based at least in part on the oversampled first duration and the oversampled second duration.

5. The non-transitory computer-readable medium of claim 4, further comprising instructions that when executed enable the system to perform operations comprising:
providing a system clock signal to the first and second TDCs, the system clock signal having a substantially greater frequency than the recovery clock signal; and
providing a reference value to adjust the oversampled first duration and the oversampled second duration, the reference value corresponding to a ratio between the system clock signal and the recovery clock signal.

6. An apparatus comprising:
an analog front end to receive a digital input and output a data stream from the digital input, the analog front end including a comparator having a first input node to receive the digital input and a second input node to receive a reference voltage;
a microcontroller coupled to the analog front end, the microcontroller to determine a power mode for the apparatus based at least in part on the digital input, obtain at least one control code stored in an entry of a storage based on the determined power mode, and control a controllable circuit element coupled to the second input node to provide a selected reference voltage level to the second input node based on the at least one control code; and
the controllable circuit element, wherein the microcontroller is to provide the at least one control code to the controllable circuit element to cause the controllable circuit element to provide the selected reference voltage to the second input node.

7. The apparatus of claim 6, wherein the apparatus comprises a clock and data recovery circuit comprising:
a first time-to-data converter (TDC) to oversample a first duration of incoming data obtained from the digital input and hold the oversampled first duration during receipt of a second duration of the incoming data obtained from the digital input;
a second TDC to oversample the second duration of the incoming data and hold the oversampled second duration during receipt of a third duration of the incoming data, the first and second TDCs to operate in opposing phases;
a processing circuit coupled to the first TDC and the second TDC, the processing circuit including a first filter to filter the oversampled first duration and the oversampled second duration and generate a control output therefrom; and
a digitally controlled oscillator (DCO) coupled to the processing circuit to receive the control output and generate a recovery clock signal therefrom.

8. The apparatus of claim 6, wherein the microcontroller is to control the controllable circuit element to provide a first reference voltage level to the second input node based on a first control code when the digital input is a first logic level, and control the controllable circuit element to provide a second reference voltage level to the second input node based on a second control code when the digital input is a second logic level.

9. The apparatus of claim 8, wherein the controllable circuit element comprises a plurality of switches coupled between a plurality of resistance elements and the second input node.

10. The apparatus of claim 6, further comprising a non-volatile storage including a plurality of entries, each entry to store one or more control codes for control of the controllable circuit element, wherein the microcontroller is to access an entry of the non-volatile storage based on the determined power mode.

11. An apparatus comprising:
a comparator having a first input node to receive a digital input, a second input node to receive a reference voltage and an output node to output a data stream from the digital input;
a controller coupled to the comparator, the controller to determine a power mode based at least in part on the digital input, obtain at least one control code stored in an entry of a storage based on the determined power mode, and control a controllable circuit element coupled to the second input node to cause a selected reference voltage level to be provided to the second input node based on the at least one control code; and
the controllable circuit element, wherein the controller is to provide the at least one control code to the controllable circuit element to cause the selected reference voltage to be provided to the second input node.

12. The apparatus of claim 11, wherein the apparatus comprises a clock and data recovery circuit comprising:
a first time-to-data converter (TDC) to oversample a first duration of incoming data obtained from the digital input and hold the oversampled first duration during receipt of a second duration of the incoming data obtained from the digital input;
a second TDC to oversample the second duration of the incoming data and hold the oversampled second duration during receipt of a third duration of the incoming data, the first and second TDCs to operate in opposing phases;
a processing circuit coupled to the first TDC and the second TDC, the processing circuit including a first filter to filter the oversampled first duration and the oversampled second duration and generate a control output therefrom; and a digitally controlled oscillator (DCO) coupled to the processing circuit to receive the control output and generate a recovery clock signal therefrom.

13. The apparatus of claim 11, wherein the controller is to control the controllable circuit element to cause a first reference voltage level to be provided to the second input node based on a first control code when the digital input is a first logic level, and cause a second reference voltage level to be provided to the second input node based on a second control code when the digital input is a second logic level.

14. The apparatus of claim 13, wherein the controllable circuit element comprises a plurality of switches coupled between a plurality of resistance elements and the second input node.

15. The apparatus of claim 11, further comprising a non-volatile storage including a plurality of entries, each entry to store one or more control codes for control of the controllable circuit element, wherein the controller is to access an entry of the non-volatile storage based on the determined power mode.

16. The apparatus of claim 11, wherein the data stream comprises bi-phase mark coded data.

17. The apparatus of claim 16, wherein the controller is to determine the power mode based on the bi-phase mark coded data.

18. The apparatus of claim 11, further comprising an analog front end including the comparator.

* * * * *